(12) United States Patent
Akinaga et al.

(10) Patent No.: US 7,863,594 B2
(45) Date of Patent: Jan. 4, 2011

(54) SWITCHING DEVICE

(75) Inventors: Hiroyuki Akinaga, Ibaraki (JP); Shuichiro Yasuda, Ibaraki (JP); Isao Inoue, Ibaraki (JP); Hidenori Takagi, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 11/990,612

(22) PCT Filed: Aug. 8, 2006

(86) PCT No.: PCT/JP2006/315629

§ 371 (c)(1),
(2), (4) Date: Sep. 15, 2009

(87) PCT Pub. No.: WO2007/020832

PCT Pub. Date: Feb. 22, 2007

(65) Prior Publication Data

US 2010/0012911 A1    Jan. 21, 2010

(30) Foreign Application Priority Data

Aug. 15, 2005  (JP) .............................. 2005-235131

(51) Int. Cl.
*H01L 47/00* (2006.01)
(52) U.S. Cl. ..................... 257/2; 257/E47.001; 365/153
(58) Field of Classification Search .................. 257/2–5, 257/E27.004, E45.002, E47.001; 365/148, 365/153, 163
See application file for complete search history.

(56) References Cited

U.S. PATENT DOCUMENTS

2008/0054243 A1  3/2008  Shima et al.

FOREIGN PATENT DOCUMENTS

| JP | P2004-363604 A | 12/2004 |
| JP | P2002-537627 A | 11/2005 |
| WO | WO 2006/028117 A1 | 3/2006 |

OTHER PUBLICATIONS

International Preliminary Report on Patentability for PCT/JP2006/315629.
Gibbons, et al., "Switching properties of thin NiO films" *Solid State Electronics*, 1964; 7 (11): 785-97.
Liu, et al., "Electric-pulse-induced reversible resistance change effect in magnetoresistive films" *Applied Physics Letters*, May 8, 2000; 76 (19): 2749-51.

*Primary Examiner*—Thomas L Dickey
(74) *Attorney, Agent, or Firm*—Medlen & Carroll, LLP

(57) ABSTRACT

An objective of the present invention is to provide a switching device that shows two markedly different stable resistance characteristics reversibly and repetitively, and which is applicable to highly integrated nonvolatile memories.

The present invention provides a switching device, which comprises a variable resistor element that has, between two electrodes, a metal-oxide thin-film comprising a single central metal element with a compositional variation; which is connected to a control circuit which can apply, between said two electrodes, a voltage or a current selected from among a voltage or a current of the first threshold or higher, a voltage or a current of the second threshold or lower whose absolute value is smaller than the absolute value of said first threshold, and a voltage or a current of the third threshold or lower whose absolute value is smaller than the absolute value of said second threshold; and in which the interelectrode resistance characteristic reversibly changes by a factor of 1,000 to 10,000 in the voltage or current region whose absolute value is equal to or below the third threshold.

12 Claims, 10 Drawing Sheets

(a)

(b)

(a)

(b)

(c)

SWITCHING DEVICE

This application is a U.S. national entry of International Application No. PCT/JP2006/315629, filed on Aug. 8, 2006, which claims priority to Japanese Patent Application No. 2005-235131, filed on Aug. 15, 2005.

TECHNICAL FIELD

The present invention relates to a switching device with highly variable resistance characteristics, and more specifically, a switching device that contains a metal oxide layer whose resistance characteristics are highly variable and which is connected to a circuit capable of controlling the hysteresis of applied power.

BACKGROUND ART

Ovonic Unified Memories (OUMs) are known as nonvolatile storage devices whose information read-out is achieved by detecting changes in resistance characteristics. OUMs use chalcogenide compounds whose resistance characteristics change significantly between crystalline and amorphous structures. Chalcogenide compounds are also adopted in phase-change optical disks such as DVD-RAM.

A recently known technique employs a nonvolatile memory device that utilizes a transition-metal oxide film of NiO, $V_2O_5$, ZnO, $Nb_2O_5$, $TiO_2$, $WO_3$, or CoO as a data-storage material layer, taking use of transition-metal oxide films' property of showing a rapid increase or decrease in resistance within a given voltage range. The resistance characteristics of the transition-metal oxide film is controlled by addressing each data-storage material layer with a transistor or the like, which is provided for each of the data-storage material layers, and applying a predetermined voltage hysteresis. The information held in the data-storage material layers is read out by detecting the resistance characteristics (see Patent Document 1).

A technique for forming memory elements is also known, in which the ferroelectric material $Pr_{0.7}Ca_{0.3}MnO_3$ is used as a data-storage layer. The resistance characteristics of the layer are varied by a factor of about 10 to 1,000 by switching the voltage applied on the data-storage layer of the ferroelectric material to positive/negative within a predetermined magnitude, after which the resistance characteristics are detected (see Non-Patent Document 1).

The switching phenomenon of resistance characteristics between 100 and 200Ω and between 10 and 20Ω in a nickel oxide thin-film formed by exposing a nickel substrate to an oxygen atmosphere has been reported to be basically consistent with calculated results obtained under the assumption of the formation and break of Ni fiber filaments formed in a NiO matrix (see Non-Patent Document 2).

Patent Document 1 Japanese Patent Application Kokai Publication No. (JP-A) 2004-363604 (unexamined, published Japanese patent application)

Non-Patent Document 1 Applied Physics Letters, Vol. 76, No. 19 (2000), pp. 2749-2751

Non-Patent Document 2 Solid-State Electronics, Vol. 7 (1964), pp. 785-797

DISCLOSURE OF THE INVENTION

Problems to be Solved by the Invention

An Ovonic Unified Memory (OUM) can retain a sufficient read-out safety margin because the resistance varies by a factor of about 1,000 between a high-resistance state and a low-resistance state; however, it is difficult to sufficiently increase the data-rewriting speed because OUM utilizes crystalline-amorphous transition and has the disadvantage of requiring a large current.

The techniques exemplified in Patent Document 1 and Non-Patent Document 1 detect the resistance of the entire memory layer directly. Thus, it is expected that the memory will operate similarly and at a high speed even when the size of the memory cell is reduced; however, optimization of device design has yet to be attained because the generation mechanism of such reversible and remarkably variable resistance characteristics are not yet sufficiently understood.

Especially in the technique exemplified in Patent Document 1, it is difficult to obtain a stable performance required in a commercial nonvolatile memory, because the resistance ratio between the high-resistance state and the low-resistance state remains at about 10, making it impossible to obtain read-out safety margins as large as those for Ovonic Unified Memories (OUMs).

In the technique exemplified in Non-Patent Document 1, the resistance ratio between a high-resistance state and a low-resistance state varies from 10 to 1,000. Thus, in addition to the fact that a technique for adjusting the resistance ratio to a desired value has not been established, it is also difficult to achieve stable composition control and a reduction in manufacturing cost because multiple oxides are used as resistors. Therefore, barriers to applying this technique in practical uses such as nonvolatile memories are currently expected to be high.

In the technique exemplified in Non-Patent Document 2, an oxide film is formed by the oxidization of a Ni substrate from its surface under an oxygen atmosphere. Thus, it is suspected that the degree of oxidization homogeneity is insufficient, metallic Ni fibers are segregated, and Ohmic contact occurs. This is supported by the extremely low resistance of 100 to 200Ω at on-time for the thickness of 2 to 30 µm, and also by the apparent tendency to be proportional to thickness.

Although Non-Patent Document 2 provides pioneering knowledge regarding the formation and break of conductive filaments, as acknowledged by the authors themselves, the switching phenomenon of the system lacks stability and is thought to be far from practical application, in which multiple repetitive uses are expected.

Means for Solving the Problems

The present invention has been accomplished to solve such technical problems, and is specified by the following.

Invention (1) relates to a switching device, which comprises a variable resistor element that has, between two electrodes, a metal-oxide thin-film comprising a single central metal element with a compositional variation; which is connected to a control circuit which can apply, between said two electrodes, a voltage or a current selected from among a voltage or a current of the first threshold or higher, a voltage or a current of the second threshold or lower whose absolute value is smaller than the absolute value of said first threshold, and a voltage or a current of the third threshold or lower whose absolute value is smaller than the absolute value of said second threshold; and in which the interelectrode resistance characteristic reversibly changes by a factor of 1,000 to 10,000 in the voltage or current region whose absolute value is equal to or below the third threshold.

Invention (2) relates to the switching device according to invention (1), wherein said metal oxide with a compositional variation is either a copper oxide CuO or an iron oxide $Fe_2O_3$.

Invention (3) relates to the switching device according to invention (1), wherein said metal oxide with a compositional variation is an oxygen-deficient copper oxide $CuO_{1-x}$, wherein the x in the formula is limited to $0<x<1$, except $x=\frac{1}{2}$.

Invention (4) relates to the switching device according to invention (1), wherein said metal oxide with a compositional variation is an oxygen-deficient iron oxide $Fe_2O_{3-y}$, wherein the y in the formula is limited to $0<y<1$, except $y=\frac{1}{3}$.

Invention (5) relates to the switching device according to invention (1), wherein said metal oxide with a compositional variation is an oxygen-excess copper oxide $Cu_{2-z}O$, wherein the z in the formula is limited to $1<z<2$.

Invention (6) relates to the switching device according to invention (1), wherein said metal oxide with a compositional variation is an oxygen-excess iron oxide $Fe_{2-w}O_3$, wherein the w in the formula is limited to $0<w<2$, except $w=\frac{1}{2}$.

Invention (7) relates to the switching device according to any one of inventions (1) to (6), wherein said variable resistor element is used as a data accumulation unit of a nonvolatile memory.

That is, in the present invention, bistable resistance characteristics are realized not by conductive filaments consisting of metallic fibers, but by forming/breaking conducting paths made by connecting electrically charged areas produced locally by a local compositional variation in a metal-oxide crystal. The bistable resistance characteristics are made controllable by the hysteresis of applied power.

The resistance ratio of 1,000 to 10,000 between the high-resistance state and the low-resistance state is specified by considering the performance needed to secure a sufficient read-out safety margin when the device is used as a nonvolatile memory element. The lower limit of 1,000 is a resistance ratio that cannot be attained by a usual transition metal oxide comprising a single central metal element; thus, such a value indirectly indicates that a central metal element with an especially highly variable composition is selected, or that a compositional variation is intentionally introduced into the metal oxide when a central metal element with a normal degree of a compositional variation is selected. The upper limit of 10,000 indirectly indicates that the degree of a compositional variation does not exceed the range of a local compositional variation within which metallic fibers are not formed.

Herein, as a metal oxide, stoichiometric, oxygen-deficient, and oxygen-excess types can be adopted as described in the present inventions (3) to (6). The composition is selected such that the resistance ratio between a high-resistance state and a low-resistance state generated by the hysteresis of applied power is between 1,000 and 10,000.

The compounds corresponding to the provisos $x=\frac{1}{2}$, $y=\frac{1}{3}$, and $w=\frac{1}{2}$ in the present inventions (3), (4), and (6), respectively, are thermally stable compounds or compounds that may exist under specific conditions such as ultra-high-pressure conditions. These provisos are intended to exclude these stable compounds from the metal oxides of the present inventions (3), (4), and (6).

EFFECTS OF THE INVENTION

Using metal oxides comprising a single central metal element, the present invention realized variation in reversible resistance characteristics by a factor of 1,000 to 10,000, which is large enough to maintain read-out safety margins without generating metallic filaments. This was achieved by generating a compositional variation in the metal oxides by selecting an appropriate central metal element and controlling the oxygen content ratio from the viewpoint of the presence probability distribution of the filaments.

The present invention also realized stable set/reset potentials to reduce device malfunction, as well as sufficient utilization durability as commercial memory by intentionally introducing a compositional variation into metal-oxide crystals comprising a single central metal element.

EXPLANATION OF SYMBOLS USED

I: ammeter
V: voltmeter

BEST MODE FOR CARRYING OUT THE INVENTION

Figure 1:
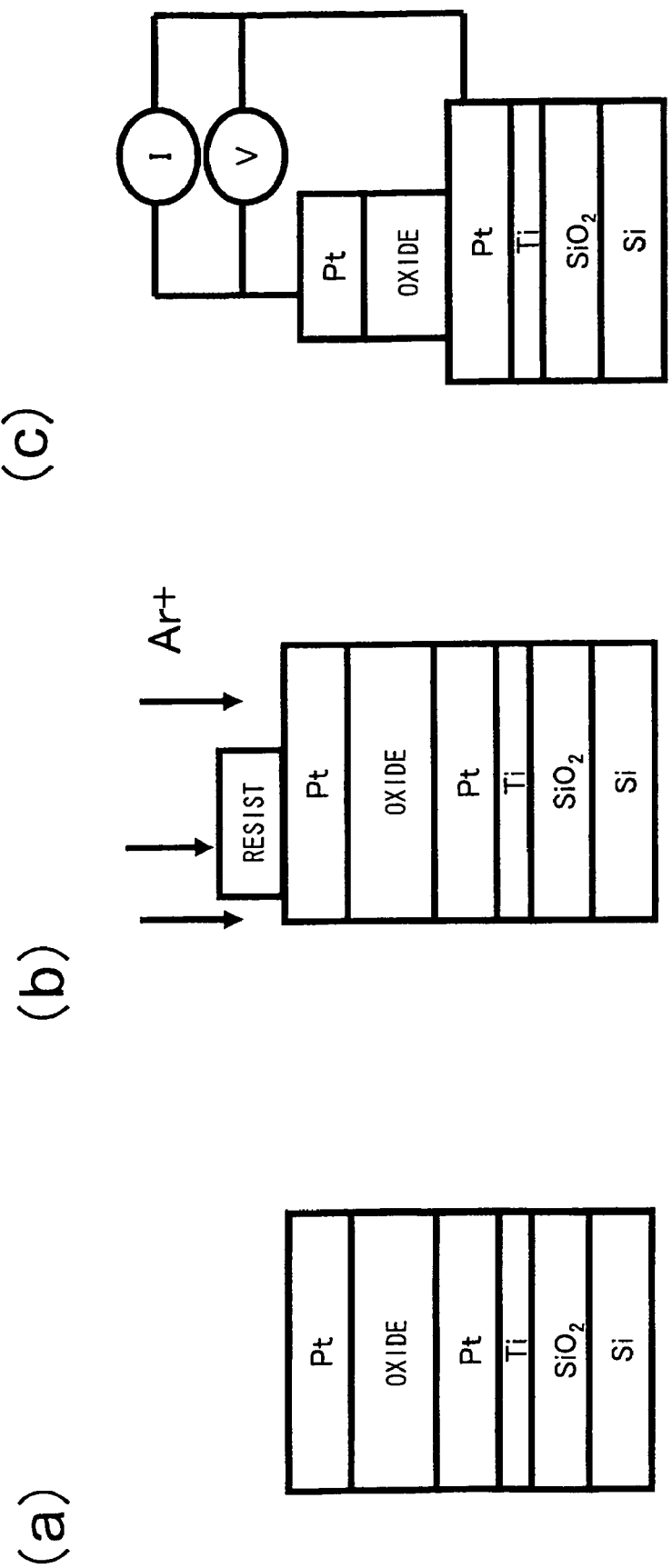
FIG. 1 shows schematic diagrams of the device structures according to the present invention and the measuring circuit.

A manufacturing method for the switching device according to the present invention is explained below. First, the RF magnetron sputtering method was used to deposit a Ti layer, a Pt layer, a metal oxide layer of $Fe_2O_3$ or CuO, and a Pt layer (in this order) onto a Si substrate with a thermally oxidized film to form a laminated structure of Ti/Pt/metal oxide (specifically, $Fe_2O_3$)/Pt, as shown in FIG. 1(a).

Herein, the Ti layer acts as a sort of glue to enhance the adhesiveness of the Pt layer, as an electrode, to the substrate. Formation of the film was carried out using a Ti target, with parameters of 200 W RF output, 0.5 Pa Ar gas pressure, and substrate temperature of 300° C.

The film formation of the Pt layer was carried out with parameters of 100 W RF output, 0.3 Pa Ar gas pressure, and with the substrate at room temperature. The film formation of $Fe_2O_3$ was carried out using an $Fe_2O_3$ target with 200 W RF output under an $O_2$ gas atmosphere containing 4% Ar at 0.67 Pa gas pressure and a substrate temperature of 300° C. When a compositional variation was intentionally introduced into the oxide layer, the gas mixing ratio of Ar and $O_2$ in the atmosphere was regulated to control the value of y in $Fe_2O_{3-y}$ and w in $Fe_{2-w}O_3$.

The composition of the oxide layer ($Fe_2O_{3-y}$) film formed under the above-mentioned deposition conditions was analyzed. The value of y was estimated to be 0.5 by energy dispersive X-ray fluorescence analysis, and to be 0.6 by X-ray photoelectron spectroscopy. The thickness of the oxide layer was taken as 100 nm when an $Fe_2O_3$ layer was selected as the oxide layer. Both of the Pt layers were set to 100 nm thick. A probe-type step-height meter from KLA-Tencor Corporation was used in measuring the film thicknesses.

Figure 2:
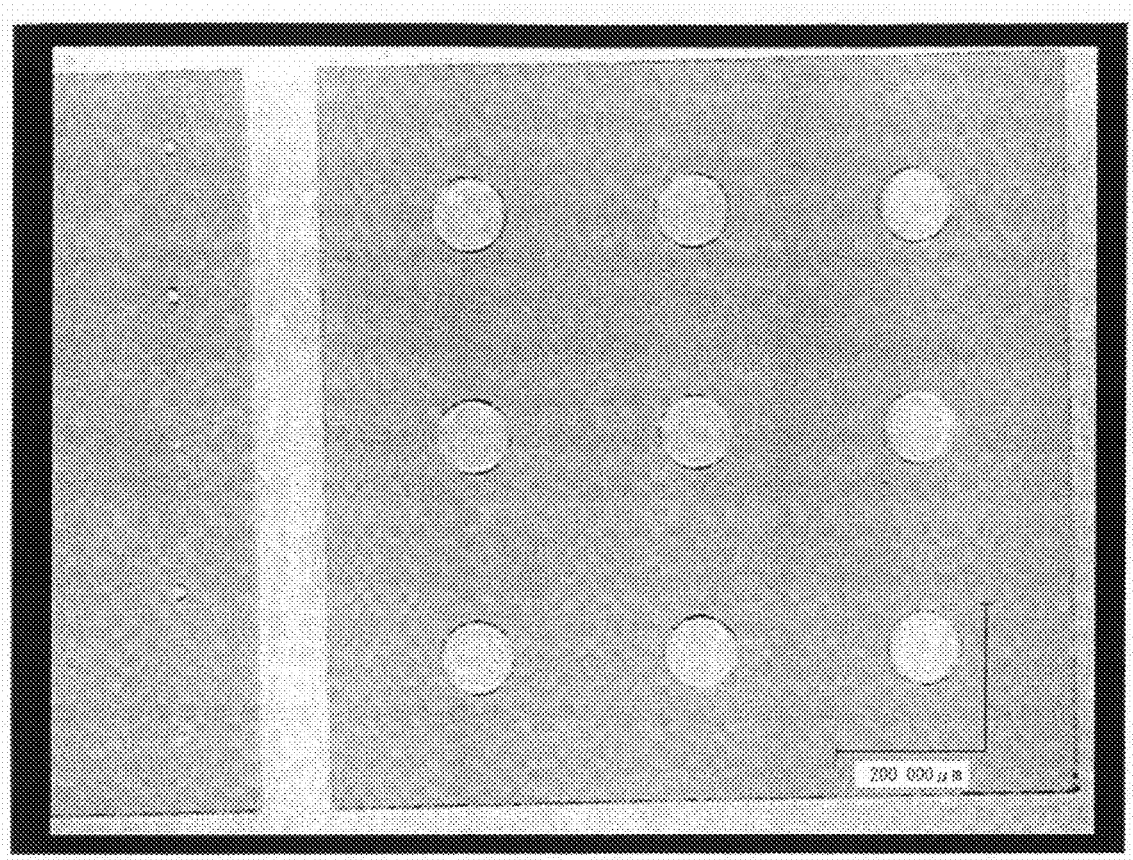
FIG. 2 shows a photograph of the upper surface of the switching device according to the present invention.

Next, as shown in FIG. 1(b), device isolation was carried out by using a reduction projection ultraviolet i-line stepper photolithography, and an Ar ion milling method. The Ar ion milling was carried out with an application voltage of 300 V. Circular electrodes were adopted, and electrodes of three different diameters (50, 100, and 200 μm) were readied. FIG. 2 shows a photograph of the appearance of the upper surface (electrode diameter: 100 μm).

Then, as shown in FIG. 1(c), a probing device was used to connect tungsten probes to the Pt surface of the above-described sandwich-like layered structure; the current-voltage (I-V) characteristics were then measured. A 4156C Semiconductor Parameter Analyzer from Agilent Technologies was used to measure the I-V characteristics of these devices.

Figure 3:
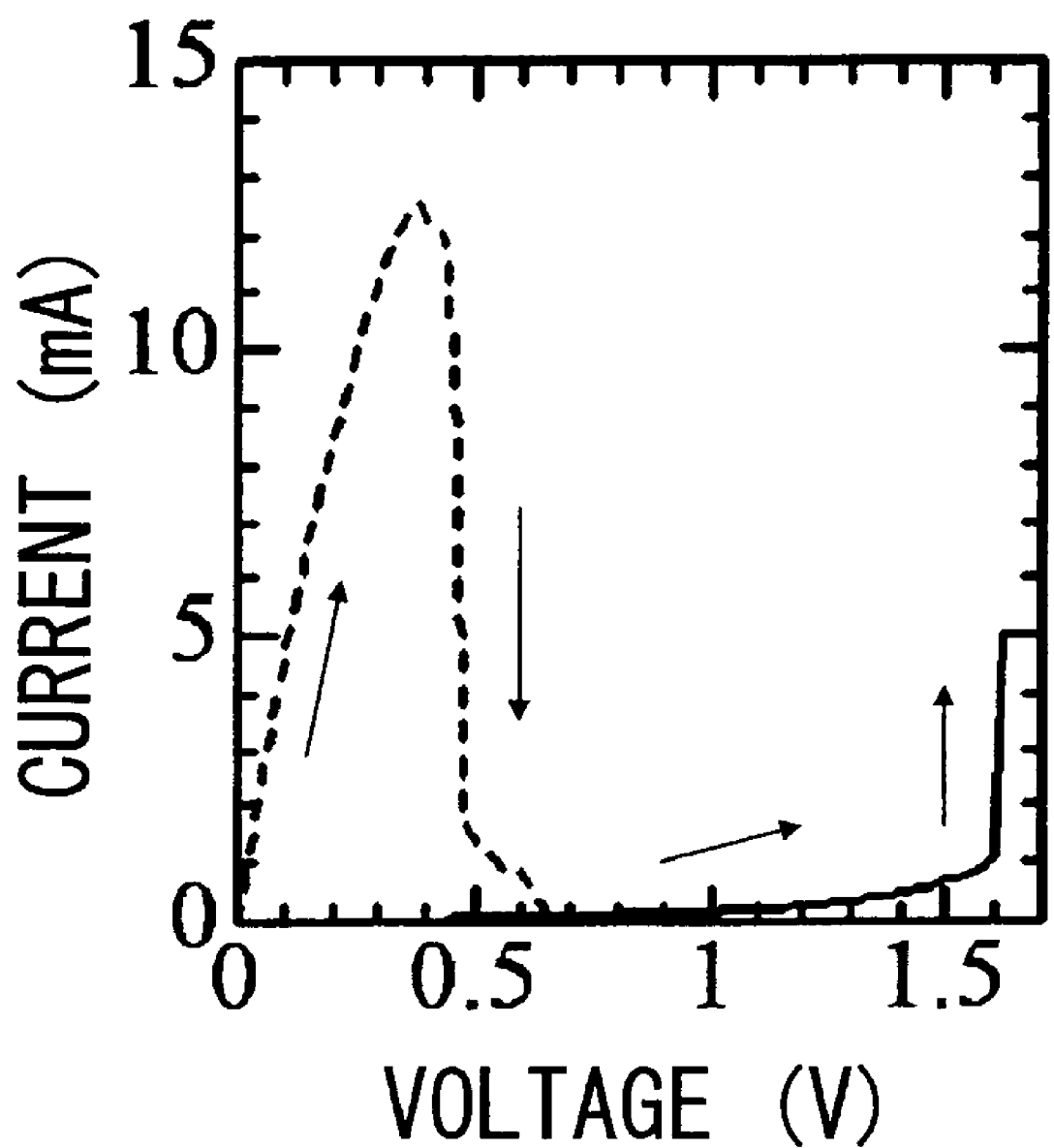
FIG. 3 shows a graph showing an example of the current-voltage characteristics of the switching device according to the present invention.

The voltage-current characteristics of the $Ti/Pt/Fe_2O_3/Pt$ laminated structure are summarized in FIG. 3. When the applied voltage was gradually increased for the first time, the current increased abruptly at about 1.6 V, as indicated by the solid line in FIG. 3, and the compliance current of the apparatus was reached. For convenience, this first application of a slightly higher voltage to generate a low-resistance state is hereafter called "forming".

When the voltage was returned to 0 V and increased once again, a current markedly larger than that which flowed before was observed, as indicated by the broken line in FIG. 3. However, a sharp decrease in current was observed at a lower voltage (about 0.35 V) than that when the compliance limit had previously been attained.

Figure 4:
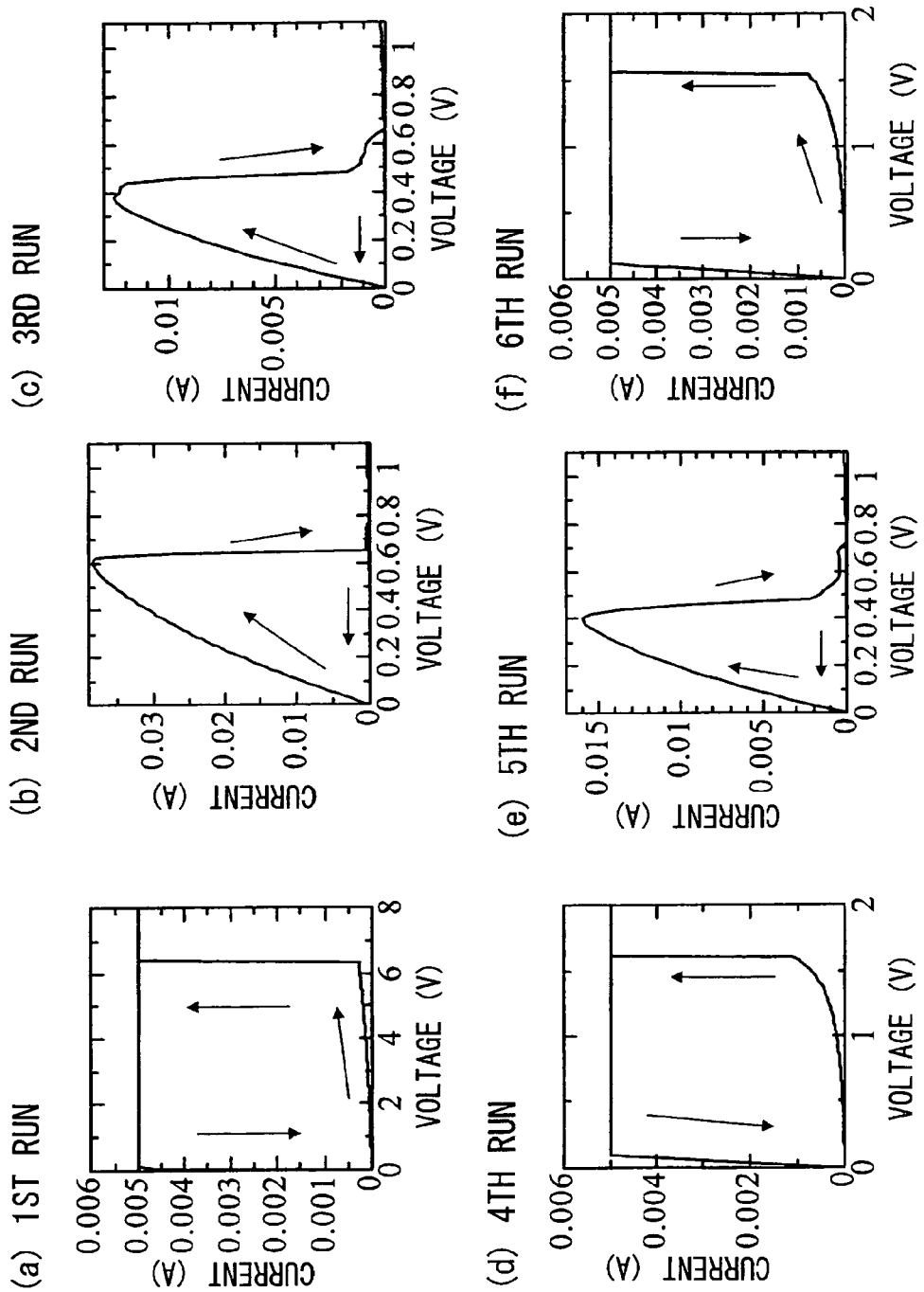
FIG. 4 shows graphs of the current-voltage characteristics given in FIG. 3 replotted for each electric power sweep.

In FIG. 4, the I-V characteristics shown in FIG. 3 are represented separately for each hysteresis of each voltage sweep. The first sweep hysteresis is shown in FIG. 4(a). The current showed a slight, linear increase with the increasing of applied voltage, and increased abruptly at about 6.5 V, reaching the compliance limit.

Next, as shown in FIG. 4(b), when the voltage application sweep was repeated, a phenomenon unlike the first sweep was observed in that a considerably larger current flowed, showing a sudden, sharp decrease at around 0.6 V. When the voltage sweep was applied again from 0 V, as shown in FIG. 4(c), a much smaller current flowed, decreasing sharply at around 0.45 V. For convenience, such an operation to give a hysteresis that changes from a low-resistance state to a high-resistance state is called "reset".

In the fourth sweep, a high-resistance state was maintained up to around 1.7 V, exceeding the above reset voltage; beyond this voltage, a low-resistance state occurred abruptly at the point that a higher current flowed, as seen in FIG. 4(d). For convenience, such an operation to give a hysteresis that changes from a high-resistance state to a low-resistance state is herein called "set".

In the fifth voltage sweep, as seen in FIG. 4(e), the low-resistance state was maintained up to near the reset voltage of the third sweep, and the state changed into the high-resistance state above that voltage. In the sixth voltage sweep, a change from high-resistance state to low-resistance state was observed at a similar voltage as that in the fourth voltage sweep, as is seen in FIG. 4(f).

Figure 5:
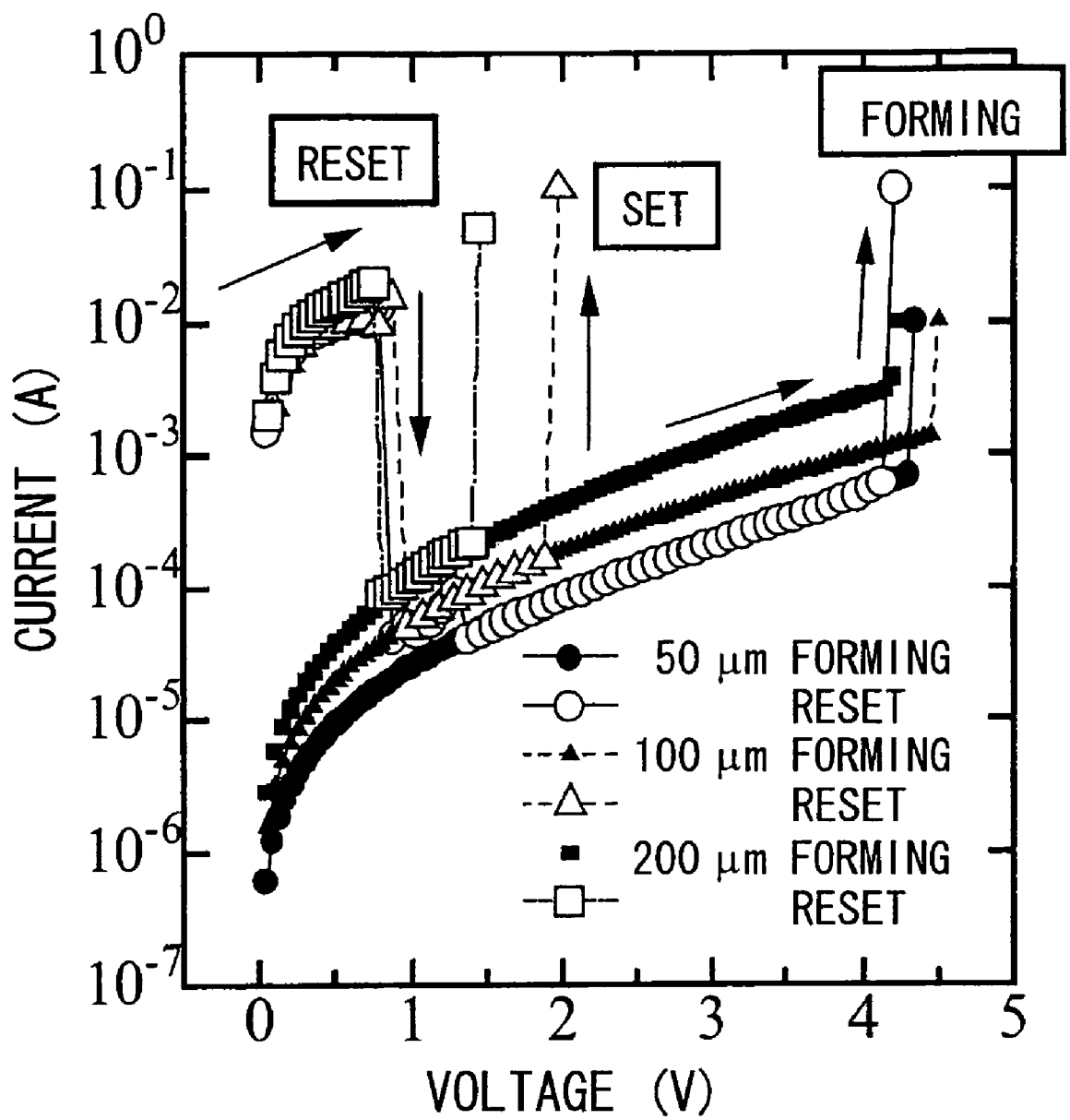
FIG. 5 is a graph showing the effect of the diameter of the device on the current-voltage characteristics according to the present invention.

FIG. 5 summarizes the voltage-current hysteresis characteristics of similar device systems but with different diameters (50, 100, and 200 μm) of the sandwiched portions including electrodes; circles represent the data for 50 μm, triangles for 100 μm, and squares for 200 μm.

As is clearly evident from the results in FIG. 5, the current in the high-resistance state showed little change despite the 4- or 16-times increase in the cross-sectional area of the electrodes. Based on this observation, a model can be assumed whereby sufficiently thin conductive paths with low resistance are formed, rather than a model whereby electric charges move uniformly through the whole cross-section of the metal-oxide layer. Given the absolute value of the resistance, it is presumed that metallic filaments were not generated.

Figure 6:
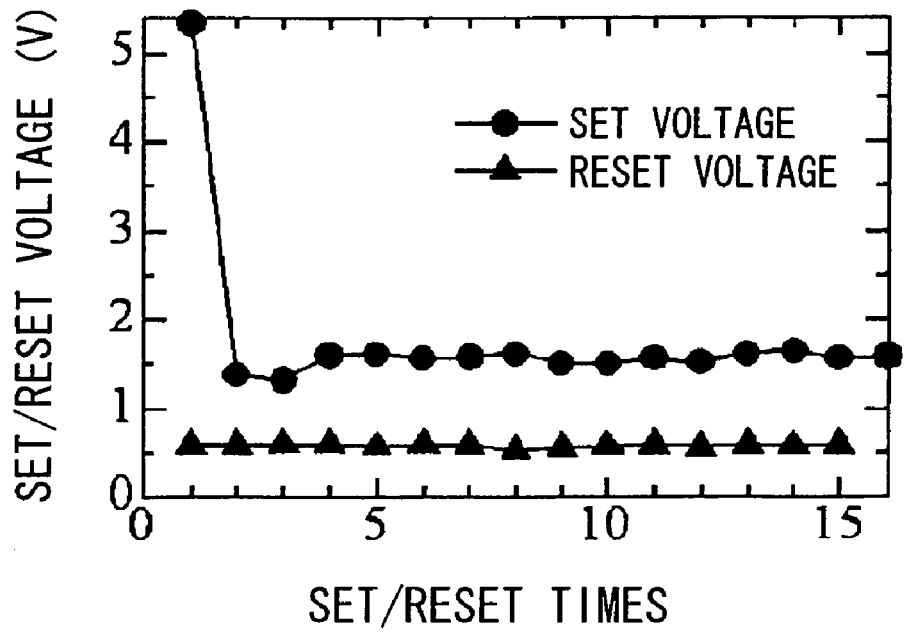
FIG. 6 shows graphs of the transition of the set/reset voltages and currents according to the present invention.
Figure 6:
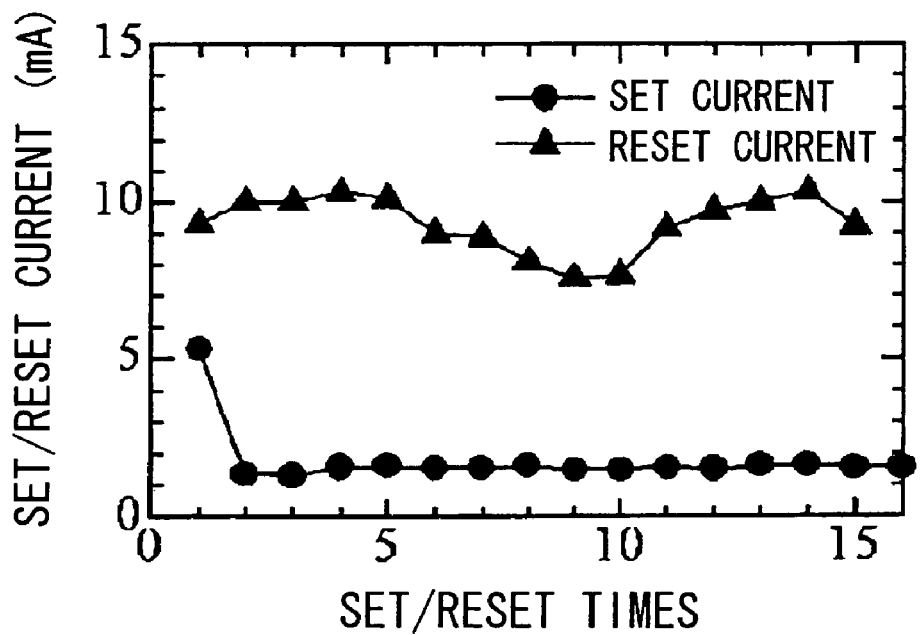

The set/reset voltage sweeps were repeated on a laminated structure system of $Ti/Pt/Fe_2O_3/Pt$ with a diameter of 100 μm; the switching voltage and current at each sweep are summarized in FIGS. 6(a) and (b), respectively. Good repeatability of sets/resets was confirmed.

A notable phenomenon was observed here: whereas both the set and reset switching voltages were largely constant, the switching currents, especially the reset currents, changed at every sweep.

Assuming that multiple, equivalent conductive paths that are sufficiently thin are formed in the metal oxide and that the same voltage is applied between the two ends of each path allowing the same current to flow, then the conductive paths should break down simultaneously when a voltage exceeding the limit is applied; which explains the switching phenomenon from a low-resistance state to a high-resistance state at an approximately constant voltage. Moreover, considering that the number of formed conductive paths is not necessarily constant, it is possible to gain a rational understanding of the changes in the total current.

In contrast, a similar tendency was not observed in switching from a high-resistance state to a low-resistance state because of differences in the measurement ranges and such. Considering that the set phenomenon is a kind of insulation-breakdown phenomenon, it is thought that the occurrence of such variations is natural and that the set phenomenon does not depend on a reset hysteresis immediately prior to the set phenomenon.

EXAMPLES

Example 1

Here, similar measurements were first carried out on the case where $CuO_{1-x}$ was adopted as the metal-oxide layer. A laminated structure of $Ti/Pt/CuO_{1-x}$ was adopted as a device structure in this case. The conditions of film formation in this case were the same as those in the case of $Fe_2O_3$ film formation, except that a CuO target was used.

Figure 7:
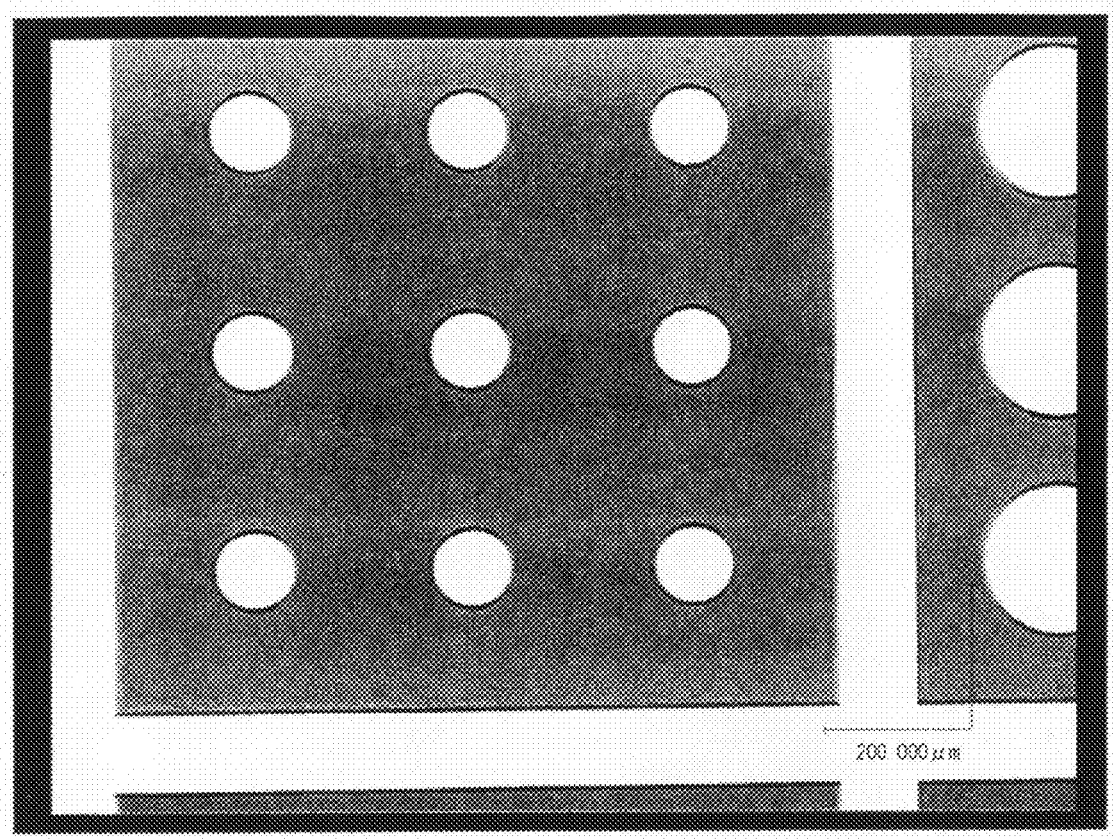
FIG. 7 is a photograph of the upper surface of the switching device according to Example 1.
Figure 8:
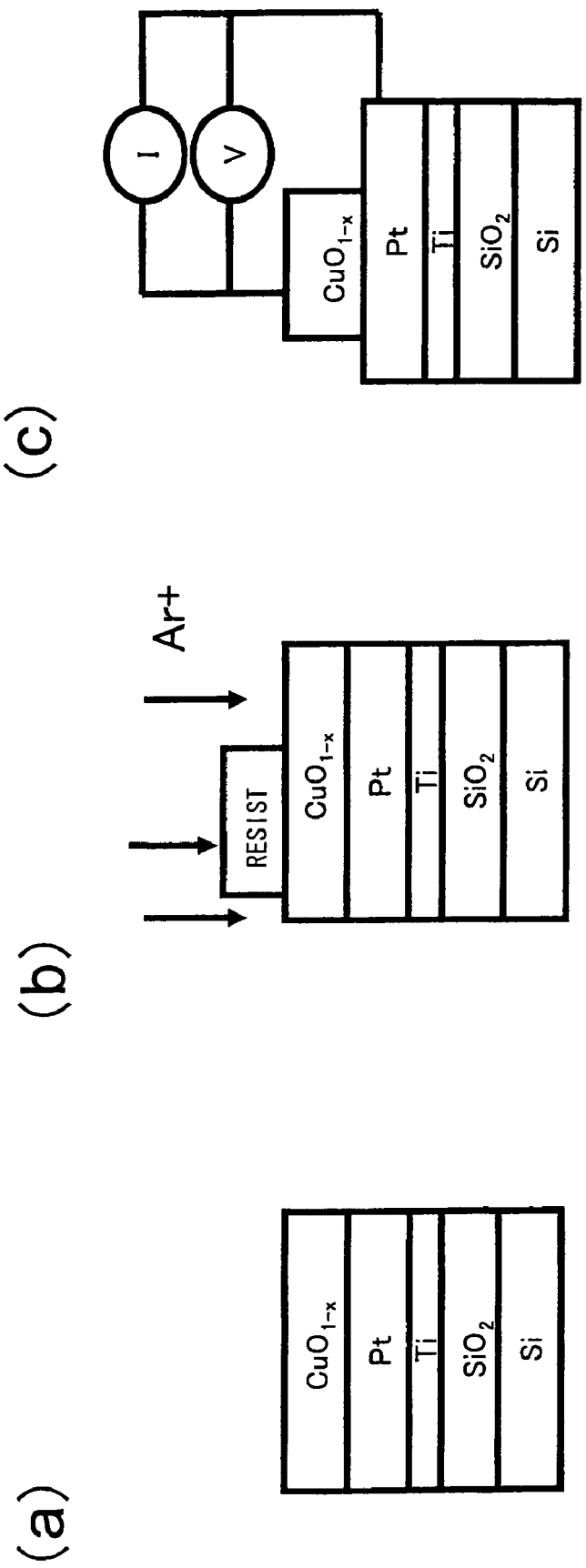
FIG. 8 shows schematic diagrams of the device structures according to Example 1 and the measuring circuit.

However, when $CuO_{1-x}$ was adopted as the oxide layer, the diameter of the $CuO_{1-x}$ surface of the laminated structure was adjusted to 100 μm as shown in FIG. 7, and the thickness of the $CuO_{1-x}$ layer was adjusted to 70 nm. Regarding the electrode structure, the upper electrode layer consisting of Pt was not provided. Current-voltage characteristics were measured by placing the tungsten probe of a probing device in contact with the surface of the $CuO_{1-x}$ layer, as shown in FIG. 8. When intentionally introducing a compositional variation into the oxide layer, the ratio of Ar to $O_2$ gas in the atmosphere was controlled to regulate the value of x in $CuO_{1-x}$ and z in $Cu_{2-z}O$.

Figure 9:
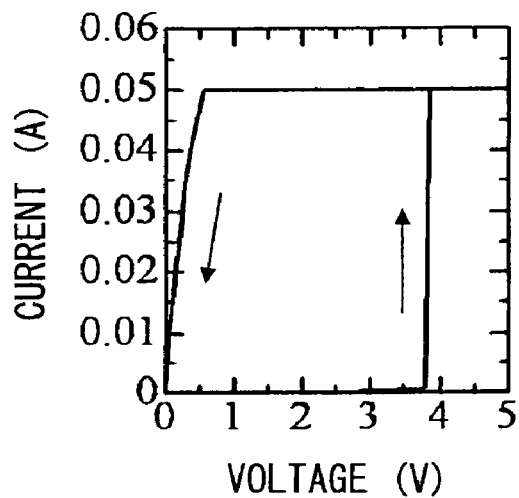
FIG. 9 shows graphs of the current-voltage characteristics of the switching device according to Example 1.
Figure 9:
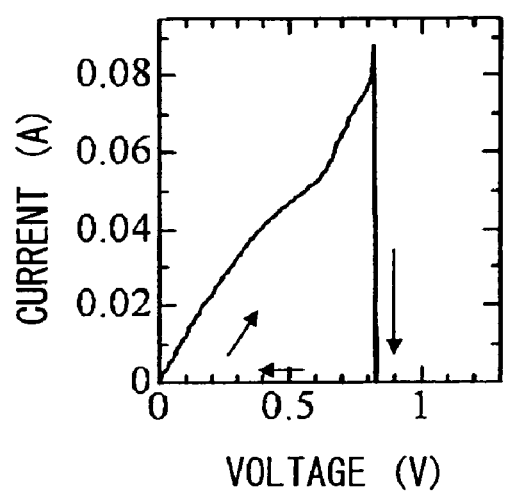
Figure 9:
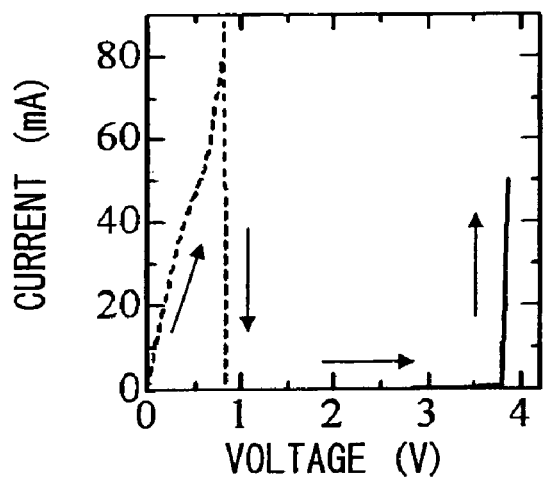

The results are shown in FIG. 9. After the application of a forming cycle, as indicated in FIG. 9(a), reset was observed near 0.8 V, as shown in FIG. 9(b); this was also observed in the case of a device with a large diameter. Subsequent set and reset cycles are summarized in FIG. 9(c). In the subsequent voltage sweeps, bistable resistance characteristics with good repeatability was observed, with stable repeats of the sets at about 3.8 V and resets at about 0.8 V.

Because the tip diameter of the tungsten probe (Luft Ltd. coaxial probe CX22C) of the probing device is about 24 μm, this device was confirmed to function satisfactorily as a switching device even if the size (the cross-sectional area) of the device is fairly reduced by large-scale integration.

Example 2

Next, using a laminated structure system of Ti/Pt/Fe$_2$O$_3$/Pt with an oxide layer with a diameter of 100 μm, the present inventors compared the different cases in terms of the method of applying electric power, voltage sweeps, and current sweeps.

First, as the first sweep, a forming procedure was performed by controlling an applied voltage and sweeping to reach the compliance setting and returning to 0 V, as shown in FIG. 10(a). When the applied voltage was controlled in the second sweep, the device changed to the high-resistance state at about 0.45 V, i.e., the device reset, and the high-resistance state was maintained while the applied voltage was swept to the range above 1 V, as shown in FIG. 10(b).

In the third sweep, an applied current was controlled instead of an applied voltage. As shown in FIG. 10(c), the high-resistance state changed to the low-resistance state at about 0.0008 A (corresponding voltage: about 1.8 V), and set was confirmed. This state was then maintained up to a current of 0.005 A.

Again, the applied current was controlled in the fourth sweep. As shown in FIG. 10(d), the low-resistance state of the previous sweep was maintained until about 0.005 A (corresponding voltage: 0.43 V), after which it suddenly changed to a high-resistance state, showing the reset. The high-resistance state was maintained for current values up to 0.01 A.

Next, the current sweep was carried out using a short integration time (640 μs, indicated as "Short" in FIG. 10(e)). Except for some differences in the current values, a hysteresis similar to the I-V characteristics of the current sweep in the third run was observed as shown in FIG. 10(e).

The voltage sweep was further carried out using a short integration time (640 μs, indicated as "Short" in FIG. 10(f)). As shown in FIG. 10(f), the state changed to a high-resistance state at about 0.4 V, the high-resistance state was maintained at least up to about 1.2 V.

Figure 10:
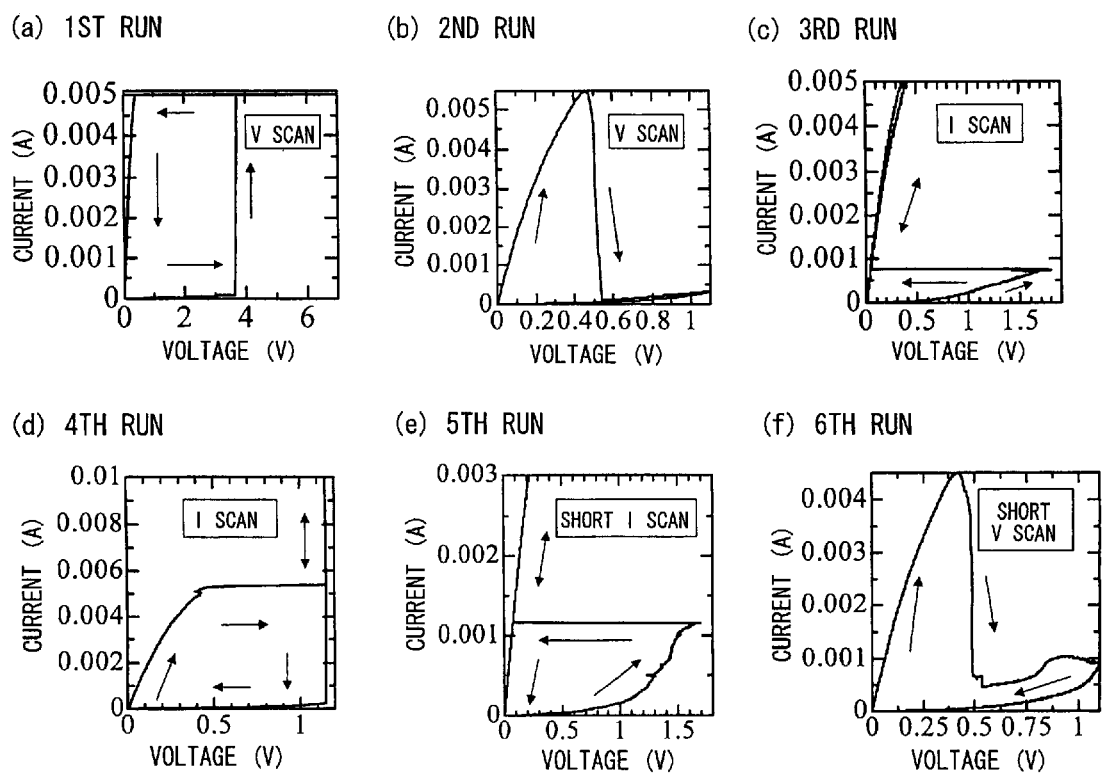
FIG. 10 shows graphs of the current-voltage characteristics of the switching device according to Example 2 replotted for each electric power sweep.

An overview of the series of changes in resistance characteristics shown in FIG. 10 reveals that the results of the voltage- and current-controlled sweeps were basically similar; a good symmetry was seen between the voltage sweeps and the current sweeps, and the system was controllable by either parameter. In addition, in view of the result that similar hystereses were shown when the electric power was applied continuously or was applied for only a short time of 640 μs, it was confirmed that a continuous power supply is not necessarily required, and that the device can be adequately driven by pulse signals.

INDUSTRIAL APPLICABILITY

As described above, the invention provides a device with a resistance that is varied stably and controllably by a factor of 1,000 to 10,000, either under voltage control or current control. Thus, a device of the preset invention can be used as a switching device.

Moreover, a device according to the present invention can provide two markedly different resistance characteristics stably and repetitively even when it has a sufficiently small cross-sectional area. Thus, the present invention can provide data-storage units of highly integrated nonvolatile memories.

The invention claimed is:

1. A switching device, which comprises a variable resistor element that has, between two electrodes, a metal-oxide thin-film comprising a single central metal element with a compositional variation; which is connected to a control circuit which can apply, between said two electrodes, a voltage or a current selected from among a voltage or a current of the first threshold or higher, a voltage or a current of the second threshold or lower whose absolute value is smaller than the absolute value of said first threshold, and a voltage or a current of the third threshold or lower whose absolute value is smaller than the absolute value of said second threshold; and in which the interelectrode resistance characteristic reversibly changes by a factor of 1,000 to 10,000 in the voltage or current region whose absolute value is equal to or below the third threshold.

2. The switching device according to claim 1, wherein said metal oxide with a compositional variation is either a copper oxide CuO or an iron oxide Fe$_2$O$_3$.

3. The switching device according to claim 1, wherein said metal oxide with a compositional variation is an oxygen-deficient copper oxide CuO$_{1-x}$, wherein the x in the formula is limited to $0 \leq x \leq 1$, except x=½.

4. The switching device according to claim 1, wherein said metal oxide with a compositional variation is an oxygen-deficient iron oxide Fe$_2$O$_{3-y}$, wherein the y in the formula is limited to $0 \leq y \leq 1$, except y=⅓.

5. The switching device according to claim 1, wherein said metal oxide with a compositional variation is an oxygen-excess copper oxide Cu$_{2-z}$O, wherein the z in the formula is limited to $1 \leq z \leq 2$.

6. The switching device according to claim 1, wherein said metal oxide with a compositional variation is an oxygen-excess iron oxide Fe$_{2-w}$O$_3$, wherein the w in the formula is limited to $0 \leq w \leq 2$, except w=½.

7. The switching device according to claim 1, wherein said variable resistor element is used as a data accumulation unit of a nonvolatile memory.

8. The switching device according to claim 2, wherein said variable resistor element is used as a data accumulation unit of a nonvolatile memory.

9. The switching device according to claim 3, wherein said variable resistor element is used as a data accumulation unit of a nonvolatile memory.

10. The switching device according to claim 4, wherein said variable resistor element is used as a data accumulation unit of a nonvolatile memory.

11. The switching device according to claim 5, wherein said variable resistor element is used as a data accumulation unit of a nonvolatile memory.

12. The switching device according to claim 6, wherein said variable resistor element is used as a data accumulation unit of a nonvolatile memory.

* * * * *

UNITED STATES PATENT AND TRADEMARK OFFICE
CERTIFICATE OF CORRECTION

PATENT NO. : 7,863,594 B2
APPLICATION NO. : 11/990612
DATED : January 4, 2011
INVENTOR(S) : Hiroyuki Akinaga et al.

Page 1 of 1

It is certified that error appears in the above-identified patent and that said Letters Patent is hereby corrected as shown below:

Column 8, line 31 should read: $0<x<1$
Column 8, line 35 should read: $0<y<1$
Column 8, line 39 should read: $1<z<2$
Column 8, line 43 should read: $0<w<2$ Signed and Sealed this
Twenty-ninth Day of May, 2012

David J. Kappos
*Director of the United States Patent and Trademark Office*